(12) United States Patent
Ricketson

(10) Patent No.: US 7,243,828 B2
(45) Date of Patent: Jul. 17, 2007

(54) TAPE FEEDER FOR COMPONENT MOUNTER AND METHOD OF AUTOMATICALLY SETTING TAPE INITIAL POSITION BY THE SAME

(75) Inventor: Tommy Howard Ricketson, Plumsteadville, PA (US)

(73) Assignee: Samsung Techwin Co., Ltd., Changwon (KR)

( * ) Notice: Subject to any disclaimer, the term of this patent is extended or adjusted under 35 U.S.C. 154(b) by 223 days.

(21) Appl. No.: 10/986,619

(22) Filed: Nov. 12, 2004

(65) Prior Publication Data

US 2006/0102681 A1    May 18, 2006

(51) Int. Cl.
*B65H 20/00* (2006.01)
*G03B 1/28* (2006.01)
(52) U.S. Cl. .......................... 226/128; 226/57
(58) Field of Classification Search ................ 226/128, 226/129, 57, 58; 414/416, 403; 156/584, 156/344; 29/426.3
See application file for complete search history.

(56) References Cited

U.S. PATENT DOCUMENTS

| | | | | |
|---|---|---|---|---|
| 2,619,006 A | * | 11/1952 | Debrie | 226/57 |
| 3,434,640 A | * | 3/1969 | Coutant et al. | 226/57 |
| 3,900,257 A | * | 8/1975 | Woolley et al. | 355/29 |
| 4,702,577 A | * | 10/1987 | Weigert | 352/191 |
| 5,529,232 A | * | 6/1996 | Blanding | 226/58 |
| 5,531,859 A | * | 7/1996 | Lee et al. | 156/584 |
| 5,543,869 A | * | 8/1996 | Vetter | 352/184 |
| 5,588,614 A | * | 12/1996 | Takada et al. | 242/538.2 |
| 5,644,376 A | * | 7/1997 | Vetter | 352/241 |
| 5,713,503 A | * | 2/1998 | Galt et al. | 226/32 |
| 5,725,140 A | * | 3/1998 | Weber et al. | 226/139 |
| 6,137,530 A | * | 10/2000 | Brown | 348/96 |
| 6,435,393 B1 | * | 8/2002 | Druzynski et al. | 226/57 |
| 6,695,032 B2 | * | 2/2004 | Kim | 156/582 |
| 6,824,033 B2 | * | 11/2004 | Chon | 226/128 |
| 2006/0102681 A1 | * | 5/2006 | Ricketson | 226/128 |

FOREIGN PATENT DOCUMENTS

KR    1020020047860 A    6/2002

* cited by examiner

Primary Examiner—Gene O. Crawford
Assistant Examiner—E. Langdon
(74) Attorney, Agent, or Firm—Drinker Biddle & Reath LLP

(57) ABSTRACT

Provided are a small tape feeder for a component mounter, which can transfer one or more strips of tape and can insert the tapes into a tape guide easily and precisely, and a method of automatically setting a tape initial position for such a tape feeder. The tape feeder includes a frame; at least one index pin, which is mounted on one side of the frame and transfers a tape by being inserted into one of tape holes, in which electronic components are received, and moves forwardly; a pin moving unit, which includes a pin horizontally moving member for horizontally moving the index pin, and a pin vertically moving member for vertically moving the index pin so that the index pin can be inserted into or removed from the tape hole; and a top cover discharging unit, which is installed on the other side of the frame and discharges a top cover detached from the tape.

19 Claims, 18 Drawing Sheets

TAPE FEEDER FOR COMPONENT MOUNTER AND METHOD OF AUTOMATICALLY SETTING TAPE INITIAL POSITION BY THE SAME

BACKGROUND OF THE INVENTION

1. Field of the Invention

The present invention relates to a tape feeder and a method of automatically setting a tape initial position by the tape feeder, and more particularly, to a tape feeder, which transfers a tape in which components are received therein, separates a top cover from the tape, and discharges the separated top cover so that the components can be picked up by a component mounter, and a method of automatically setting a tape initial position by the tape feeder.

2. Description of the Related Art

A tape feeder supplies components to a component mounter, such as a chip mounter. Then, the chip mounter mounts the components, e.g., semiconductor chips, in certain positions on a printed circuit board. That is, the tape feeder supplies various kinds of components in various ways to the chip mounter and the chip mounter mounts them on the printed circuit board using a suction nozzle operated by a robot.

The way of supplying the components varies according to the operating conditions and the characteristics of the components. For example, large components are supplied by being carried on a tray but small components do not require a tray.

In particular, very small components are frequently lost or damaged during mounting, and thus, they require a special tape feeder. Accordingly, as shown in FIG. 1, a tape 2, which has a plurality of receiving spaces 2a aligned thereon such that a plurality of components 5, e.g., semiconductor chips, are received in the receiving spaces 2a and covered and sealed by a top cover 2b, and also has a plurality of tape holes 2c formed on a side thereof at predetermined intervals, is transferred to a component mounter by a tape feeder.

The tape 2, to which the small-sized components are attached at the predetermined intervals, is wound around a roll, and the tape feeder pulls the tape 2 from the roll and at the same time removes the top cover 2b, which covers the components 5 retained by the tape 2. A suction nozzle operated by a robot lifts the components from the tape (from which the top cover has been removed) and moves the components to the predetermined positions on the printed circuit board.

FIG. 2 is a perspective view of a conventional tape feeder for a component mounter disclosed in Korean Patent Publication No. 2002-0047860. Referring to FIG. 2, a tape feeder 10 includes a frame 11, a tape transferring unit 20 for transferring a tape 2 at a predetermined pitch, a top cover discharging unit 40 for discharging a top cover detached from the tape, a driving unit 50 for simultaneously or separately driving the tape transferring unit 20 and the top cover discharging unit 40, and a shutter unit 70 for preventing electronic components from being separated.

The tape transferring unit 20 includes a sprocket 22, which has teeth inserted into tape holes 2c of the tape 2 and transfers the tape 2 at a predetermined pitch. The tape 2 is engaged with the sprocket 22 by a tape guide 71, and a top cover 2b is discharged upwardly past the tape guide 71.

The sprocket 22 is rotated by a transfer worm gear 57 and a transfer worm wheel 58 meshing with the transfer worm gear 57, which are driven by a driving motor 52. In this case, a ratchet 31 and a stopper 32 prevent the reverse rotation of the sprocket 22.

Also, the tape feeder 10 includes a rotational angle sensing unit 80, which is installed on a frame 11 and senses a rotational angle of the sprocket 22. The rotational angle sensing unit 80 includes an encoder 81 and a sensor 82 for sensing a value of the encoder 81.

The top cover discharging unit 40 includes a first discharge gear 41 and a second discharge gear 42. The first discharge gear 41 and the second discharge gear 42 meshing with each other receive the top cover 2b therebetween and discharge the top cover 2b.

To be more specific, a discharge intermediate gear 59 rotates due to a driving force of the driving motor 52, and accordingly, a discharge worm gear 62 is driven. A discharge worm wheel 63 is driven due to the rotation of the discharge worm gear 62, and a second roller 64 and a first roller 65 rotate accordingly. Then, the first discharge gear 41 and the second discharge gear 42 rotate simultaneously, resulting in the discharge of the top cover 2b.

The second discharge gear 42 is connected to one end of a second discharge lever 67, and the other end of the second discharge lever 67 is fixed an end portion of the frame 11. A second discharge lever spring 67a is installed on the other end of the second discharge lever 67 and elastically biases the second discharge gear 42 toward the first discharge gear 41.

Such a conventional tape feeder 10 using the sprocket 22 suffers from the following problems.

First, since the transfer worm gear 57 is used to rotate the sprocket 22, a considerable space for the transfer worm gear 57 is required.

Second, to pick up the components 5 at precise and flat positions, the tape 2 needs to move linearly in a predetermined section. However, since the sprocket 22 rotates circularly, linear motion stability of the tape 2 receiving the very small electronic components is difficult.

Third, the tape feeder 10 uses the sprocket 22 to feed the tape 2, the transfer worm gear 57 and the transfer worm wheel 58 to drive the sprocket 22, the ratchet 31 and the stopper 32 to prevent the reverse rotation of the carrier tape 2, and the rotational angle sensing unit 80 to sense the rotational angle of the sprocket 22. Accordingly, for example, to transfer two strips of tape, two sets of the above elements are required. As a result, when multiple strips of tape are transferred by one tape feeder, the tape feeder must be large and the manufacturing costs thereof are high.

Fourth, in the tape feeder 10 using the sprocket 22, when the tape 2 is first loaded in the tape feeder 10, the tape guide 71 is opened, the teeth of the sprocket 22 are manually inserted into the tape holes 2c, the tape guide 71 is closed, and feeder setting is performed. It is not easy to manually insert the teeth of the sprocket 22 into the tape holes 2c since the teeth of the sprocket 22 and the tape holes 2c of the tape 2 are small. If the teeth of the sprocket 22 are incorrectly inserted into the tape holes 2c, the tape 2 may be incorrectly positioned.

Furthermore, because the top cover discharging unit 40 includes the discharge intermediate gear 59, the discharge worm gear 62, the discharge worm wheel 63, the second roller 64, the first roller 65, the second discharge lever 67, and the second discharge lever spring 67a, the structure is complex and occupies a large space. Additionally, in the case of a large tape feeder, it is difficult to discharge the top cover 2b in a direction orthogonal to a direction in which the tape 2 is fed.

Moreover, since the top cover 2b is removed from the tape 2 only by tension between the first discharge gear 41 and the second discharge gear 42, it is not easy to detach the top cover 2b from the tape 2. As the top cover discharging unit 40 is used repeatedly, a force necessary for pulling the top cover 2b from the tape 2 may be changed, requiring the unit to be maintained and adjusted.

SUMMARY OF THE INVENTION

The present invention provides a tape feeder including a tape transferring unit, which transfers a tape that has small tape holes formed therein and allows many components to be attached to the tape.

The present invention further provides a tape feeder including a tape transferring unit, which does not use a sprocket and a worm gear, permits the tape to move linearly so that components can be picked up at precise and flat positions, and has high precision in transferring the tape.

The present invention also provides a tape feeder including a top cover discharging unit, which is small and simple in structure, and particularly, in case of a large tape feeder, can discharge a top cover in a direction orthogonal to a direction in which a tape is transferred.

The present invention provides a tape feeder, which does not occupy large space but can transfer a plurality of strips of tape.

The present invention further provides a tape feeder, which can easily separate a top cover from a tape.

The present invention also provides a tape feeder in which a tape having tape holes formed therein may be more easily inserted correctly into a feed guide and a method of automatically setting a tape initial position by the tape feeder.

According to an aspect of the present invention, there is provided a tape feeder for a component mounter, the tape feeder comprising: a frame; at least one index pin, which is mounted on one side of the frame and transfers a tape by being inserted into a tape hole and moving forwardly; a pin moving unit, which includes a pin longitudinally moving member for moving the index pin in the direction of tape transfer, and a pin orthogonally moving member for moving the index pin so that the index pin can be inserted into or removed from the tape hole; and a top cover discharging unit, which is installed on the other side of the frame and discharges a top cover detached from the tape.

The pin longitudinally moving member (or pin horizontally moving member) may comprise: a driving force transfer part, which is connected to the index pin and moves backwardly and forwardly; and a rotating motor, which drives the driving force transfer part.

The pin orthogonally moving member (or pin vertically moving member) may comprise a voice coil motor, which is connected to a lower portion of the index pin and moves vertically the index pin.

At least two index pins may be formed in parallel, voice coil motors may be placed corresponding to the index pins, and all the index pins may be connected to the pin horizontally moving member.

The tape feeder may further comprise a sensor, which is disposed in the index pin so that the index pin can be correctly inserted into the tape hole.

The tape feeder may further comprise a tape fixing unit, which prevents the tape from shaking except when the index pin is inserted into the tape hole and the tape is transferred, wherein the tape fixing unit comprises: a clamp driving motor; a clamp arm, which is connected to the clamp driving motor, has one end on which a vertically movable motor connecting part is formed and the other end on which an upwardly projecting tape fixing part is formed, and is disposed along a tape transfer path below the tape; and a clamp arm hinge axis part, which is installed on a central portion of the clamp arm and fixes the tape by lifting the tape fixing part formed on the other end of the clamp arm when the motor connecting part formed on the one end of the clamp arm is lowered.

The tape fixing unit may comprise a clamp arm spring, which is connected between the clamp arm and the frame and elastically supports the clamp arm.

The tape feeder may further comprise a separating blade, which is installed behind the index pin in a tape transfer direction and is moved between the tape and the top cover to separate the top cover from the tape.

According to another aspect of the present invention, there is provided a tape feeder for a component mounter, the tape feeder comprising: a frame; an index pin, which is mounted on one side of the frame and moves forwardly after being inserted into one of tape holes of a tape in which electronic components are received; a pin moving unit, which includes a pin horizontally moving member for backwardly and forwardly moving the index pin and a pin vertically moving member for vertically moving the index pin so that the index pin can be inserted into or removed from the tape hole; and a top cover discharging unit, which is driven by the pin horizontally moving member, and includes a pair of discharge gears, which receive a top cover of the tape therebetween and discharge the top cover when the index pin moves forwardly.

The top cover discharging unit may comprise: a back and forth link, which has one end connected to the pin horizontally moving member and moves backwardly and forwardly; a cam, which is connected to the other end of the back and forth link and rotates when the back and forth link moves backwardly and forwardly; a rack gear, which meshes with the cam and moves vertically when the cam rotates; a pinion, which meshes with the rack gear and rotates when the rack gear moves vertically; and the pair of discharge gears including a main discharge gear, which rotates only when the pinion rotates in one direction, and an idle discharge gear such that the main discharge gear and the idle discharge gear receive the top cover therebetween and discharge the top cover.

The rack gear is disposed on an end of a vertically moving shaft and other end of the vertically moving shaft contacts the cam such that the vertically moving shaft is lowered or lifted according to a rotational direction of the cam, and a first elastic spring may elastically bias the vertically moving shaft toward the cam so that the vertically moving shaft contacts the cam.

The pinion and the main discharge gear may be connected by a main discharge shaft, and the main discharge shaft and the main discharge gear may be connected by a one-direction bearing.

The top cover discharging unit may further comprise a discharge bracket, which is coupled to the frame and supports the main discharge shaft, the idle discharge gear may be supported by an idle discharge shaft fixed to the discharge bracket, and a second elastic spring may be installed on the idle discharge shaft to elastically bias the idle discharge gear toward the main discharge gear.

The pin horizontally moving member may comprise a driving force transfer part, which is connected to the index pin and moves backwardly and forwardly the index pin, and a rotating motor, which drives the driving force transfer part, and the back and forth link has one end connected to the driving force transfer part and moves backwardly and forwardly.

A plurality of index pins may be formed to transfer a plurality of strips of tape, all the index pins may be connected to one pin horizontally moving member, one back and forth link, and one cam, and a plurality of vertically moving shafts may be formed corresponding to the index pins and coupled to the cam.

According to still another aspect of the present invention, there is provided a method of automatically setting a tape initial position by a tape feeder for a component mounter of claim 1, through which a tape hole of a tape, which is inserted into a tape guide, is correctly moved to a feeder-set position, the method comprising the operations of: moving an index pin to a predetermined starting point; grasping a position of the tape hole within a predetermined distance and moving the index pin to a correct position of the tape hole; inserting the index pin into the tape hole; and moving the index pin to a predetermined feeder-set position.

The operation of grasping the position of the tape hole and moving the index pin to the correct position of the tape hole may comprise the operations of: judging whether the position of the tape hole is equal to a position of the index pin; and storing a correct position of the index pin if the position of the tape hole is judged to be equal to the position of the index pin.

If the position of the tape hole is judged not to be equal to the position of the index pin, the method may comprise the operations of: grasping the position of the tape hole within the predetermined distance, and moving the index pin to the position of the tape hole; and judging whether the new position of the index pin is equal to the position of the tape hole.

The operation of storing the correct position of the index pin may comprise the operations of: moving the index pin from the predetermined starting point to a tape hole starting position within the predetermined distance, and detecting the tape hole starting position; moving the index pin to a tape hole ending position, and detecting the tape hole ending position; and moving the index pin to a tape hole intermediate position between the first tape hole and the final tape hole, and storing the correct position of the index pin.

A sensor may be installed in the index pin, and the operations of grasping the position of the tape hole and moving the index pin to the correct position of the tape hole may be performed while the index pin with the sensor therein moves.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which preferred embodiments of the invention are shown.

Figure 3:
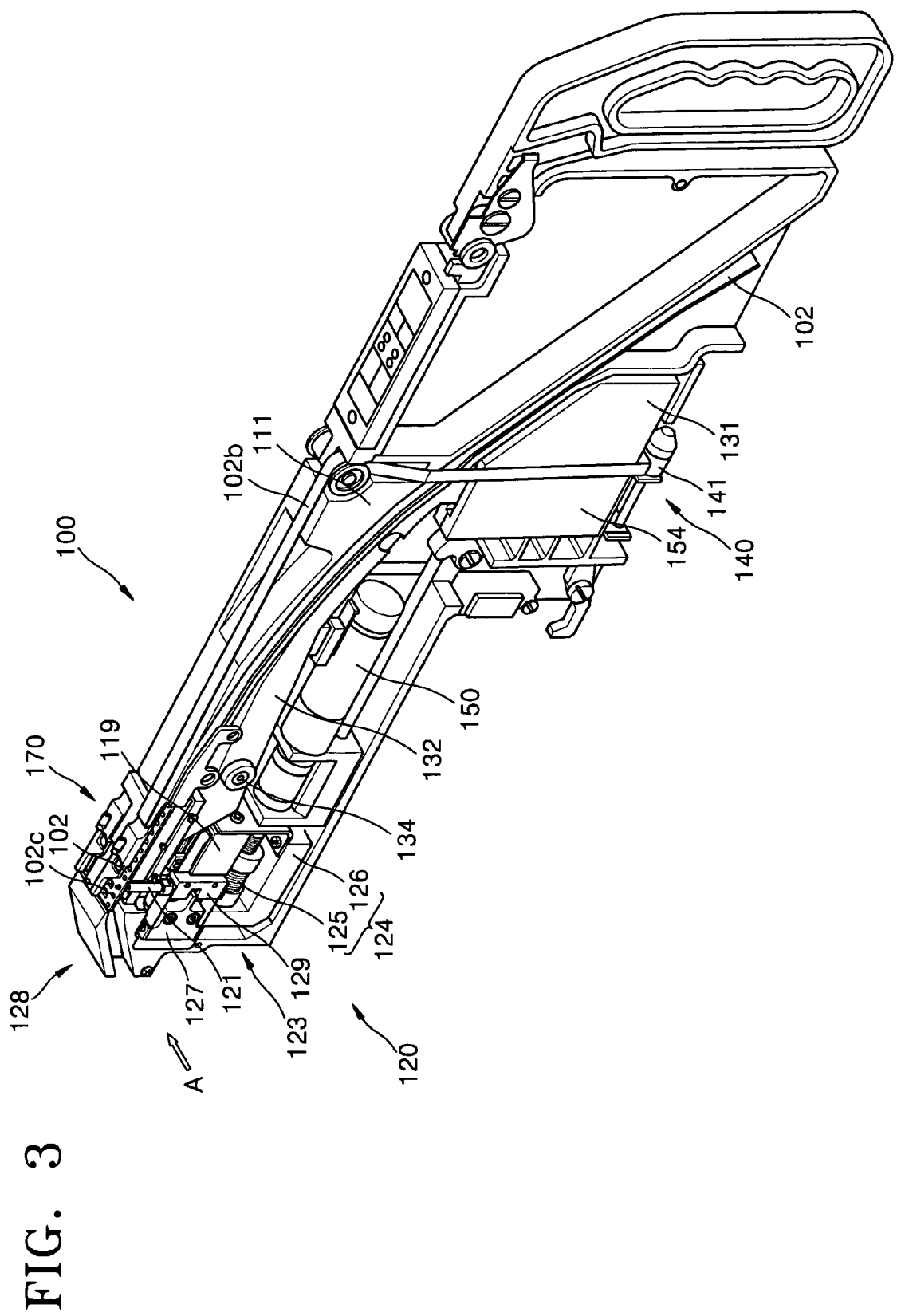
FIG. 3 is a perspective view of a tape feeder for a component mounter according to a first preferred embodiment of the present invention.
Figure 4:
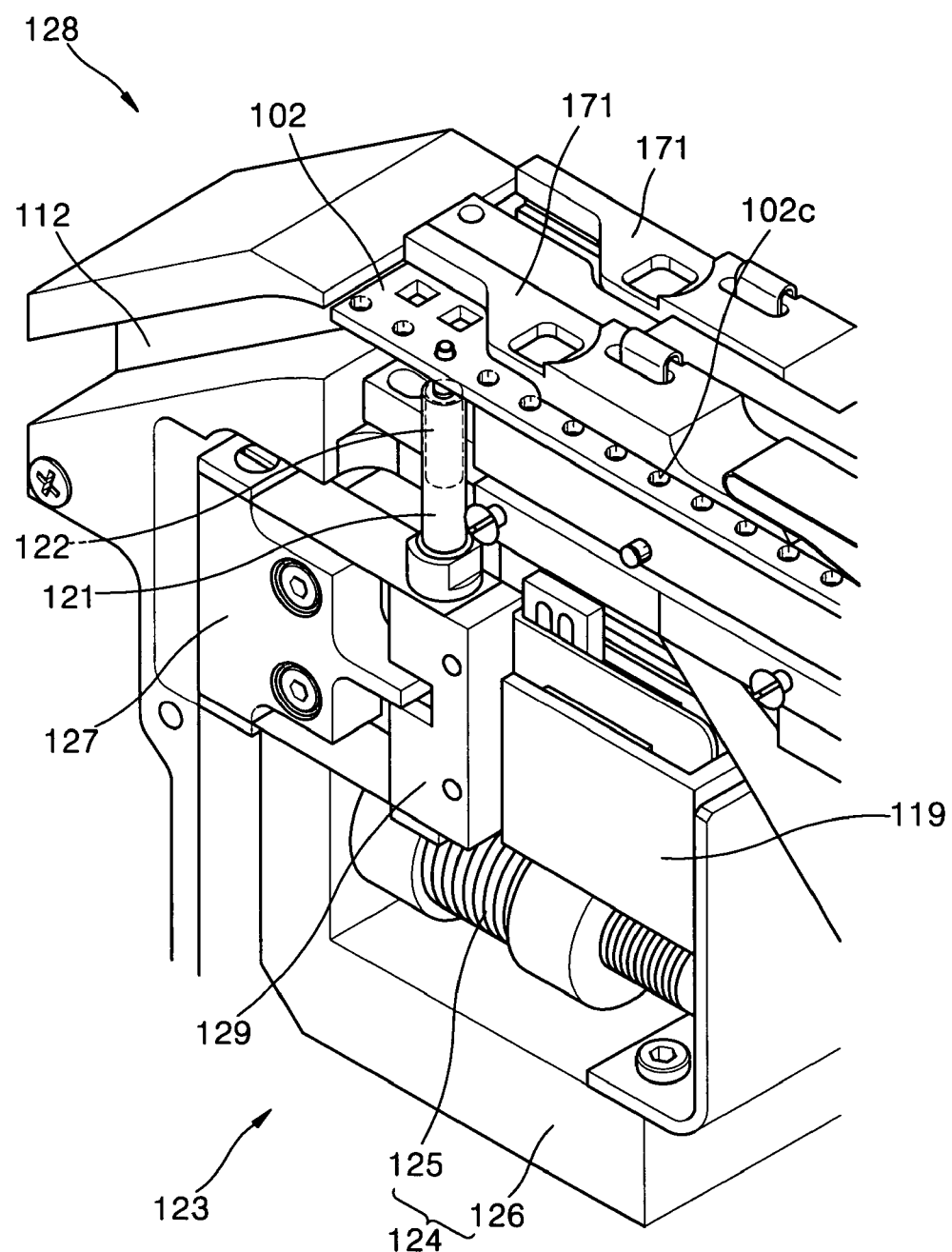
FIG. 4 is an enlarged perspective view of a portion A shown in FIG. 3.

Referring to FIGS. 3 and 4, a tape feeder 100 for a component mounter according to a first preferred embodiment of the present invention includes a frame 111, an index pin 121, which is mounted on one side of the frame 111, a pin moving unit 120, which moves the index pin 121 vertically or horizontally, and a top cover discharging unit 140, which is mounted on another side of the frame 111.

The index pin 121 is inserted into one of tape holes 102c. Thereafter, the pin moving unit 120 transfers the index pin 121 inserted into the tape hole 102c to a correct feeder-set (FS) position on the frame 111, separates the index pin 121 from the tape hole 102c, and returns the index pin 121 to a starting point. By repeating the steps, the tape 102 can be transferred intermittently. After components received in the tape 102 are picked up, the tape is outwardly discharged through a tape outlet 112.

The top cover discharging unit 140 is installed on the other side of the frame 111. The top cover discharging unit 140 includes a pair of discharge gears 141, which mesh with each other such that they receive and pass a top cover 102b, which is detached from the tape 102, therebetween. Accordingly, the top cover discharging unit 140 also serves to separate the top cover 102b from the tape 102.

Here, the pin moving unit 120 includes a pin horizontally moving member 123 and a pin vertically moving member 128. The pin horizontally moving member 123 preferably includes a rotating motor 150 and a driving force transfer part 124, which moves backwardly and forwardly the index pin 121 using the rotating motor 150. The index pin 121 is connected to the driving force transfer part 124 such that the index pin 121 can move forwardly or backwardly according to the rotation of the driving force transfer part 124.

It is preferable that the driving force transfer part 124 includes a lead screw 125 and a transfer bracket 126, which moves backwardly and forwardly according to the rotation of the lead screw 125. Consequently, the driving force transfer part 124 can correctly transfer the tape 102 without occupying a large space.

That is, as shown in FIGS. 3 and 4, the driving force transfer part 124 includes the lead screw 125 and the transfer bracket 126 installed on the lead screw 125, and the transfer bracket 126 moves horizontally according to the rotation of the lead screw 125 driven by the rotating motor 150. Here, the transfer bracket 126 is connected to the index pin 121 such that the index pin 121 moves horizontally when the transfer bracket 126 moves horizontally.

The driving force transfer part 124 adopted in the present invention is not restricted to the lead screw 125, but may include other items, such as a linear motion (LM) guide, which can move horizontally due to the rotating motor 150.

If the driving force transfer part 124 includes the lead screw 125, it is preferable that an index pin guide part 127 is formed in front of the index pin 121 to prevent the index pin 121 from being excessively advanced or lifted.

The pin vertically moving member 128 includes a voice coil motor 129, which is connected to a lower portion of the index pin 121 and moves vertically the index pin 121. It is preferable that the voice coil motor 129 is mounted on a motor support 119, and the motor support 119 is connected to the driving force transfer part 124. That is, the motor support 119 connects the transfer bracket 126 to the index pin 121 such that the index pin 121 moves backwardly and forwardly when the transfer bracket 126 moves backwardly and forwardly.

A voice coil motor 129 generally includes an operation part made of a magnet and a voice coil surrounding the operation part. If current flows through the voice coil, the operation part moves vertically according to Fleming's left hand rule. Thus, the index pin 121 is connected to the operation part, and the index pin 121 can move vertically according to the operation of the voice coil motor 129.

Furthermore, as shown in FIG. 4, a sensor 122 may be installed in the index pin 121 so that the index pin 121 can be correctly inserted into the tape hole 102c. In this case, it is preferable that the sensor 122 is a fiber optic sensor so as to be installed in the index pin 121 and exactly sense the tape hole 102c.

Figure 5:
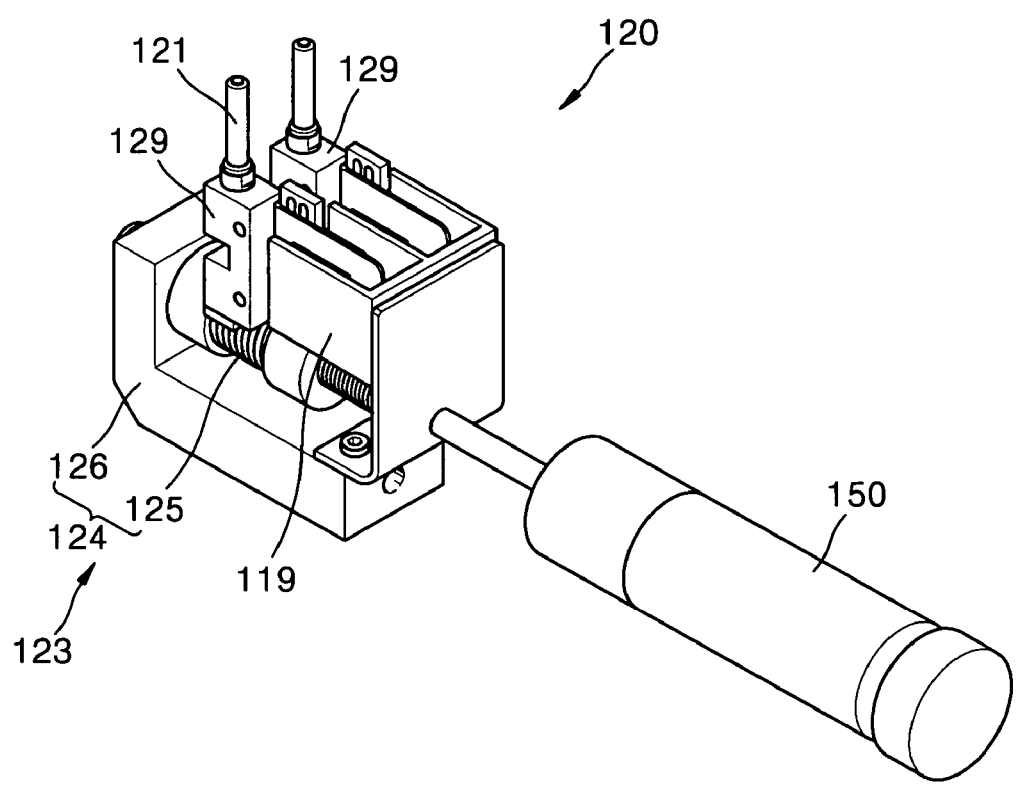
FIG. 5 is a perspective view of a pin moving unit used for transferring a plurality of strips of tape in the tape feeder of FIG. 3.

Further, as shown in FIG. 5, two index pins 121 may be formed in parallel, two voice coil motors 129 may be placed corresponding to the two index pins 121, and the two index pins 121 may be connected to the pin horizontally moving member 123. That is, the pin horizontally moving member 123 moves horizontally the two index pins 121, and the small voice coil motors 129 move vertically the two index pins 121. As a consequence, the pin horizontally moving member 123 and the pin vertically moving member 128 can move the two index pins horizontally and vertically, respectively, without occupying large spaces.

In the meantime, it is preferable that the tape 102 moves only when it is transferred. If the tape 102 shakes after the index pin 121 is detached from the tape hole 102c, it is difficult to insert the index pin 121 into the tape hole 102c formed in the tape 102 and to separate the top cover 102b from the tape 102.

Accordingly, it is more preferable that the tape feeder 100 may further include a tape fixing unit 130. The tape fixing unit 130 prevents the tape 102 from shaking except when the index pin 121 inserted into the tape hole 102c of the tape 102 is transferred.

Figure 6A:
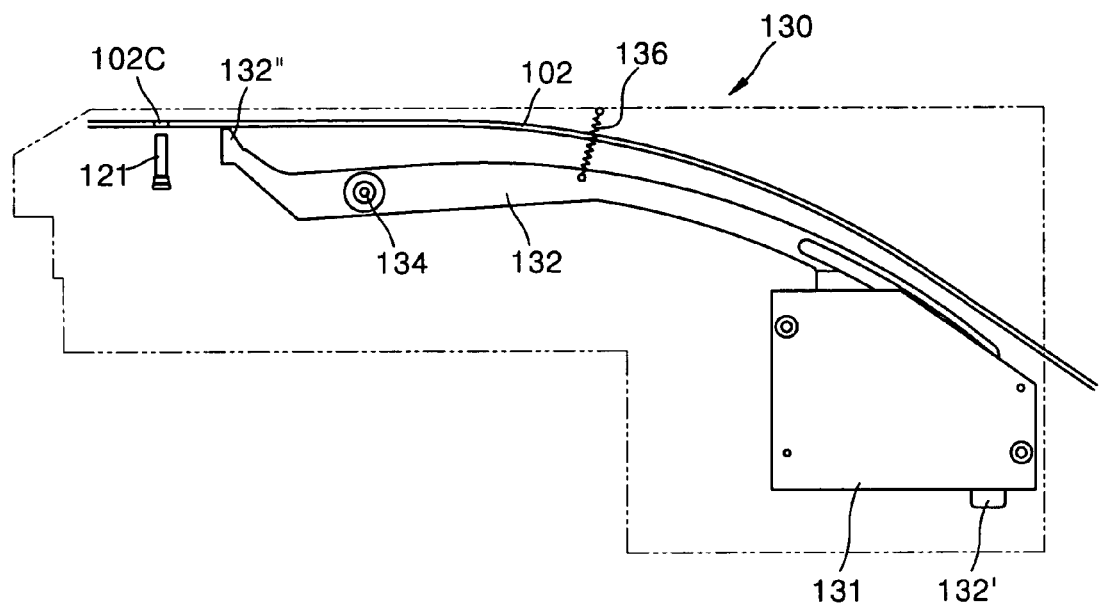
FIGS. 6A and 6B are sectional views illustrating the operation of a tape fixing unit of the tape feeder of FIG. 3.
Figure 6B:
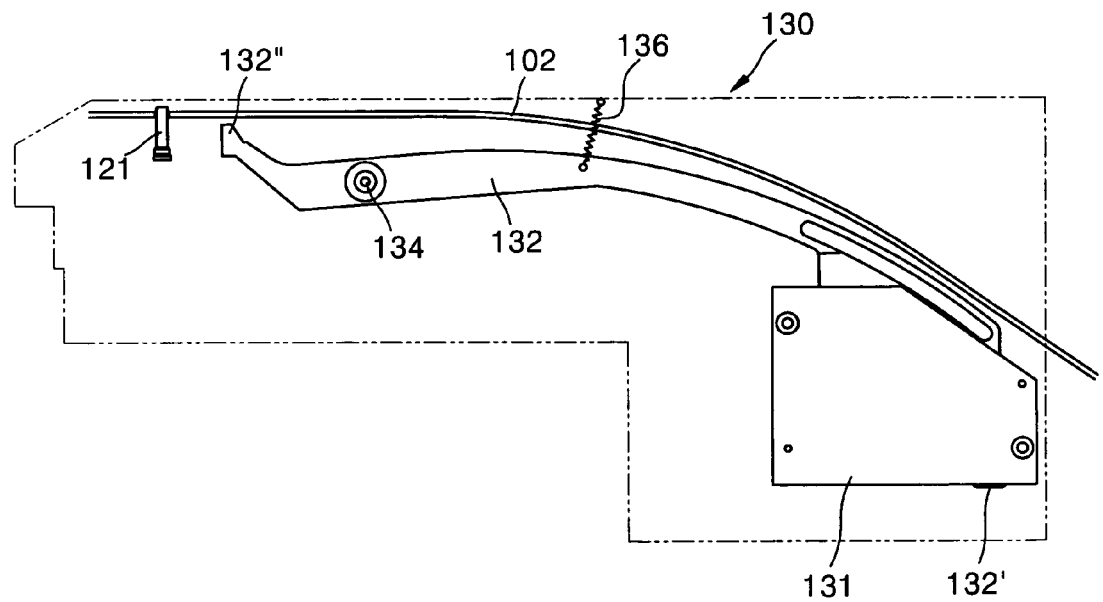

In this case, as shown in FIGS. 6A and 6B, the tape fixing unit 130 includes a clamp driving motor 131, a clamp arm 132, and a clamp arm hinge axis part 134. A motor connecting part 132' is formed on one end of the clamp arm 132 and is connected to the clamp driving motor 131, and a tape fixing part 132" is formed on the other end of the clamp arm 132.

The clamp arm hinge axis part 134 is formed on a central portion of the clamp arm 132, and is coupled to the frame 111. Accordingly, when the motor connecting part 132' is lowered, the tape fixing part 132", which is opposite to the motor connecting part 132' across the clamp arm hinge axis part 134, is lifted to come in contact with the tape 102 and fix the tape 102.

In contrast, when the motor connecting part 132' is lifted, the tape fixing part 132" is lowered by the clamp arm hinge axis part 134 such that the tape fixing part 132" is separated from the tape 102 and does not fix the tape 102.

Therefore, it is preferable that when the index pin 121 is inserted into the tape hole 102c to transfer the tape 102, the clamp arm 132 is spaced apart from the tape 102 to smoothly transfer the tape 102, and when the index pin 121 is separated from the tape hole 102c and returns to the starting point, the tape fixing part 132" contacts the tape 102 to fix the tape 102.

Additionally, the tape fixing unit 130 may further include an arm lever spring 136 to elastically support the clamp arm 132 on the frame 111.

Figure 7:
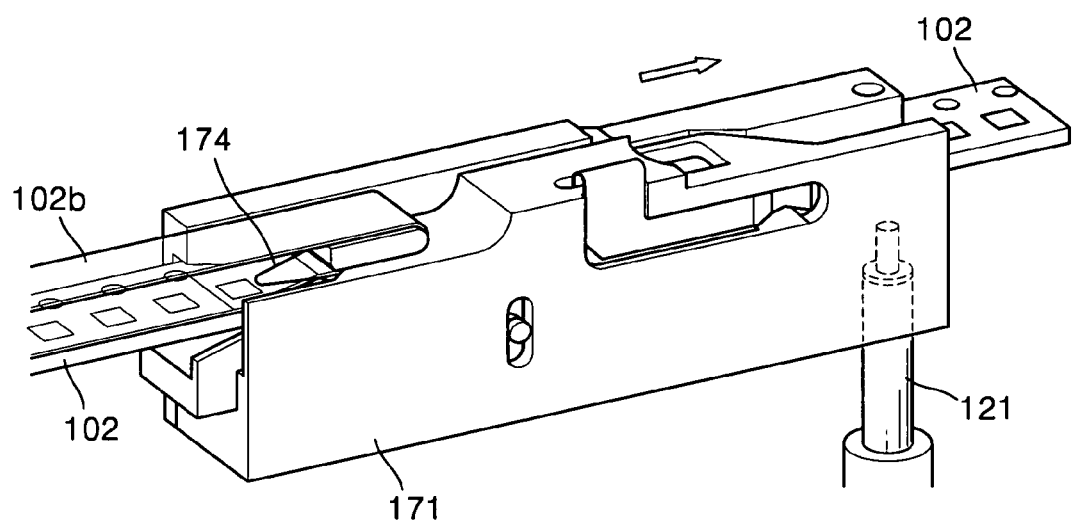
FIG. 7 is a perspective view of a separating blade of the tape feeder of FIG. 3.

Meanwhile, as shown in FIG. 7, it is preferable that in a tape guide 171, which guides the tape 102 so that the index pin 121 can be inserted into the tape hole 102c of the tape 102, a separating blade 174 is installed behind the index pin 121 and is moved between the top cover 102b and the tape 102 to easily separate the top cover 102b from the tape 102.

Figure 1:
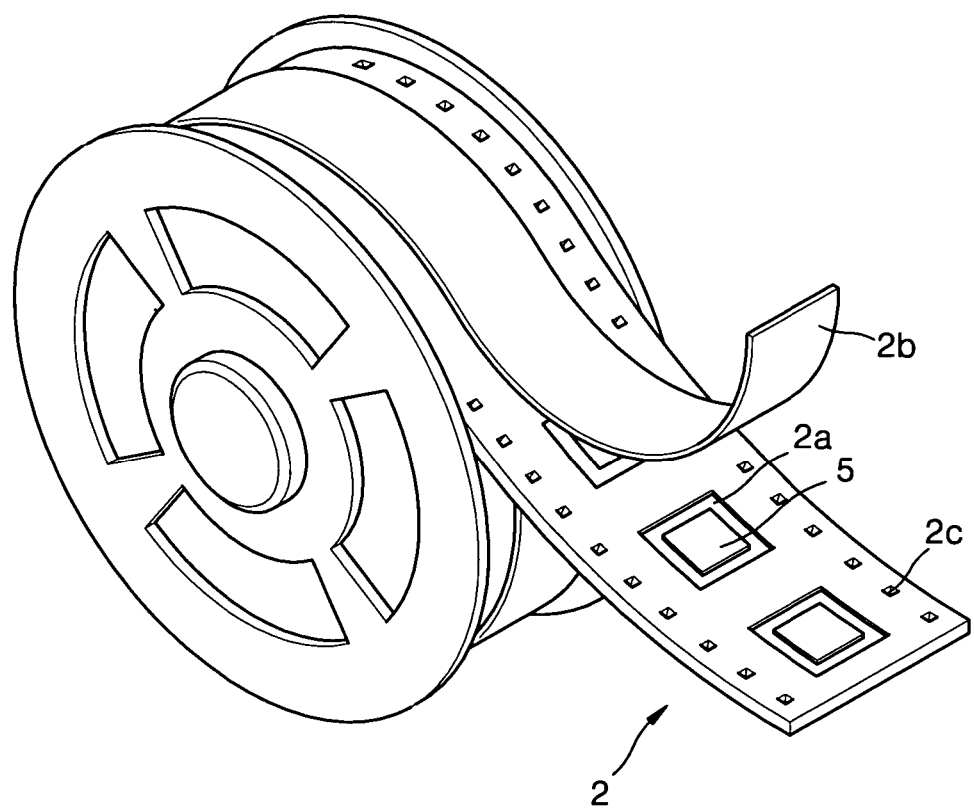
FIG. 1 is a perspective view of a conventional tape for a component mounter.
Figure 2:
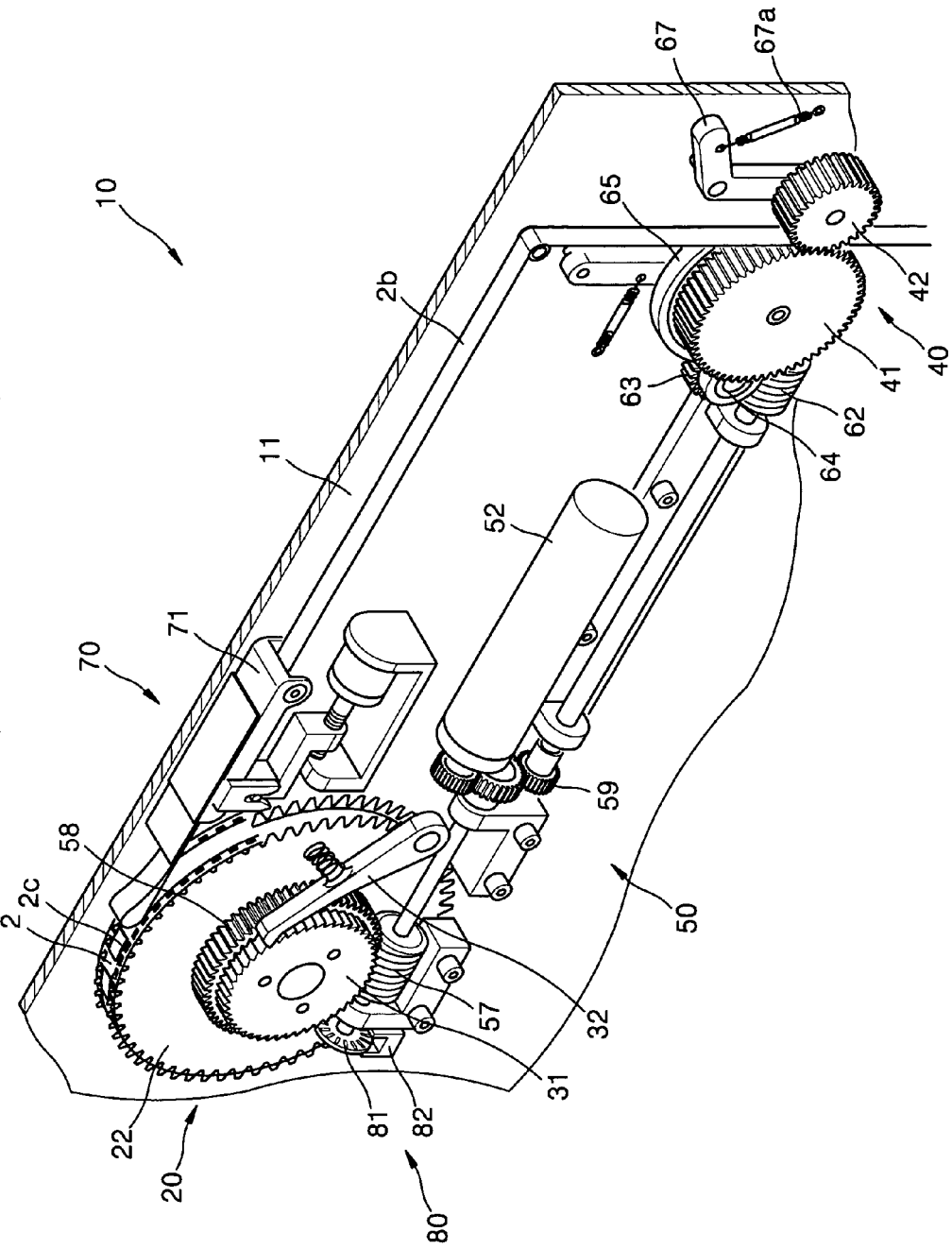
FIG. 2 is a perspective view of a conventional tape feeder for a component mounter.

Accordingly, in contrast to a conventional tape feeder 10 of FIG. 2 in which a top cover 2b is detached from a tape 2 only due to tension between a pair of discharge gears 41 and 42, the tape feeder 100 according to the present invention includes the separating blade 174 disposed behind the index pin 121 to easily separate the top cover 102b from the tape 102, thereby preventing an error that may occur when the top cover 2b is repeatedly discharged.

The operation of the tape feeder 100 constructed as above will now be explained. When the tape 102 enters into the tape guide 171, a tape feeder setting step starts. That is, while moving within a predetermined distance, the index pin 121 senses the tape hole 102c within the predetermined distance. In this case, the tape hole 102c of the tape 102 is sensed by the sensor 122 installed inside the index pin 121, and can move within the predetermined distance due to the pin horizontally moving member 123. At this time, the clamp arm 132 of the tape fixing unit 130 is lifted to contact and fix the tape 102.

As the sensor 122, preferably a fiber-optic sensor, senses the tape hole 102c, the index pin 121 is moved to a position of the tape hole 102c and is inserted into the tape hole 102c by the pin vertically moving member 128. Thereafter, the index pin 121 is moved to the predetermined FS position, such that the tape 102 into which the index pin 121 is inserted is set to the FS position.

Next, the tape 102 is intermittently transferred as shown in FIGS. 8A through 8E. Referring to FIGS. 3, and 8A through 8E, when the index pin 121 inserted into the tape hole 102c reaches the FS position, the index pin 121 is lifted by the pin vertically moving member 128 (see FIG. 8A), and then is forwardly moved by the pin horizontally moving member 123 to transfer the tape 102 (see FIG. 8B).

Figure 8A:
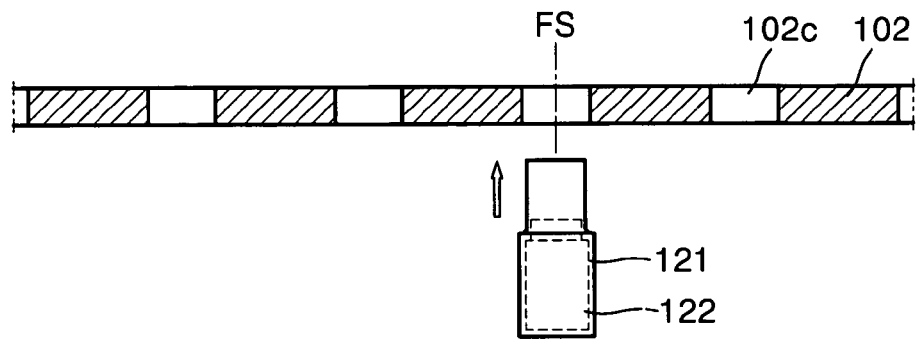
FIGS. 8A through 8E are sectional views illustrating steps of transferring a tape using an index pin of the tape feeder of FIG. 3.
Figure 8B:
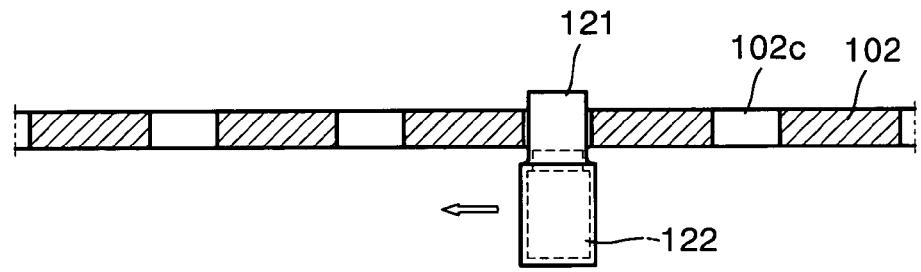
Figure 8C:
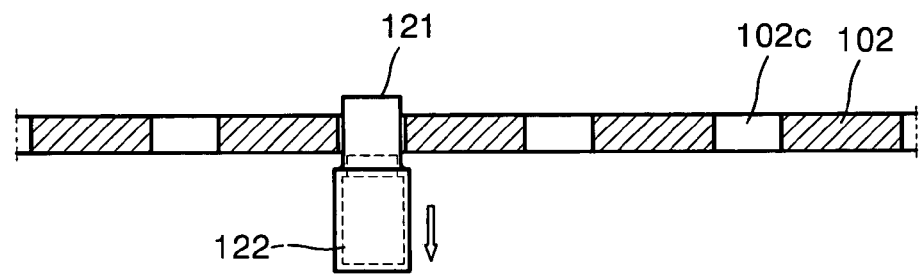
Figure 8D:
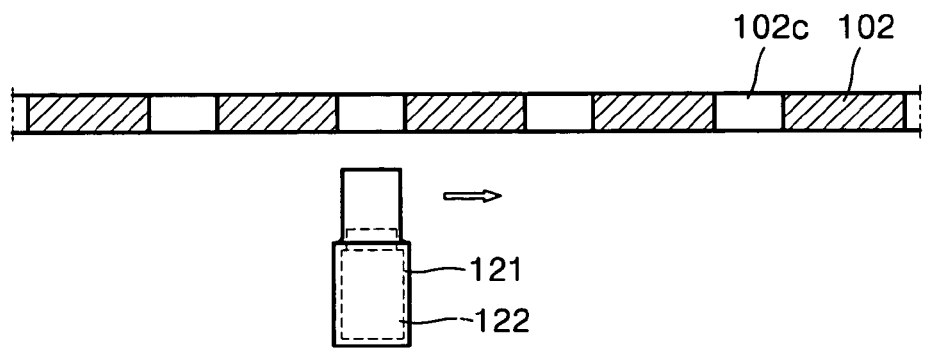
Figure 8E:
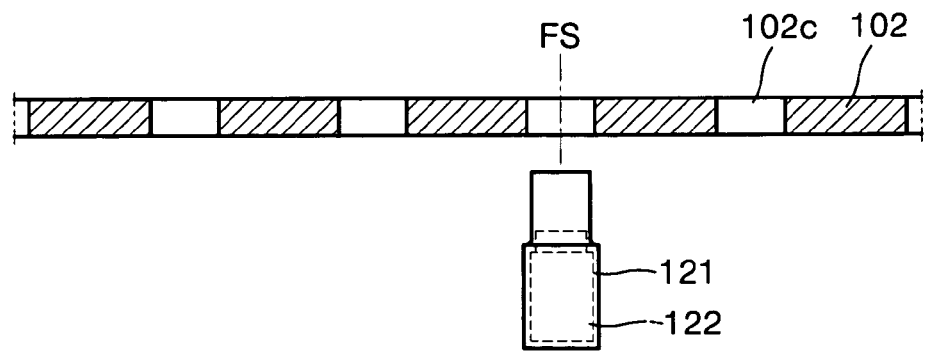

Next, the index pin 121 is lowered by the pin vertically moving member 128, is separated from the tape hole 102c (see FIG. 8D), and returns to the FS position by the pin horizontally moving member 123 (see FIG. 8E). The index pin 121 intermittently transfers the tape 102 by repeating the above operations.

When the tape 102 is transferred, the motor connecting part 132' is lifted by the tape fixing motor 131 and the tape fixing part 132" is lowered so as not to contact the tape 102.

On the other side, when the index pin 121 is not inserted into the tape hole 102c, the motor connecting part 132' is lowered by the tape fixing motor 131 and the tape fixing part 132" is lifted to contact the tape 102 and fix the tape 102. In this case, it is preferable that the tape fixing unit 130 further includes a clamp arm spring 135. The clamp arm spring 135 connects between the clamp arm 132 and the frame 111, and elastically supports the clamp arm 132.

The present invention does not use a sprocket 22 but uses the index pin 121 to transfer the tape 102. Accordingly, since the tape 102 is transferred by the index pin 121, the tape 102 can linearly move within at least the distance in which the tape 102 engaged with the index pin 121 moves. Consequently, since a component pick up device (not shown) can now pick up the components in a horizontal state, precision of the pickup work increases and a pickup error is avoided.

Moreover, since the tape 102 is transferred using the index pin 121, a transfer pitch can be controlled such that a larger number of components can be attached to the tape 102. Since a worm gear 57 is not required to rotate the sprocket 22, a space for the tape transferring unit 120 is reduced. Since abrasion of the worm gear does not occur, precision in tape transfer is high.

Figure 9:
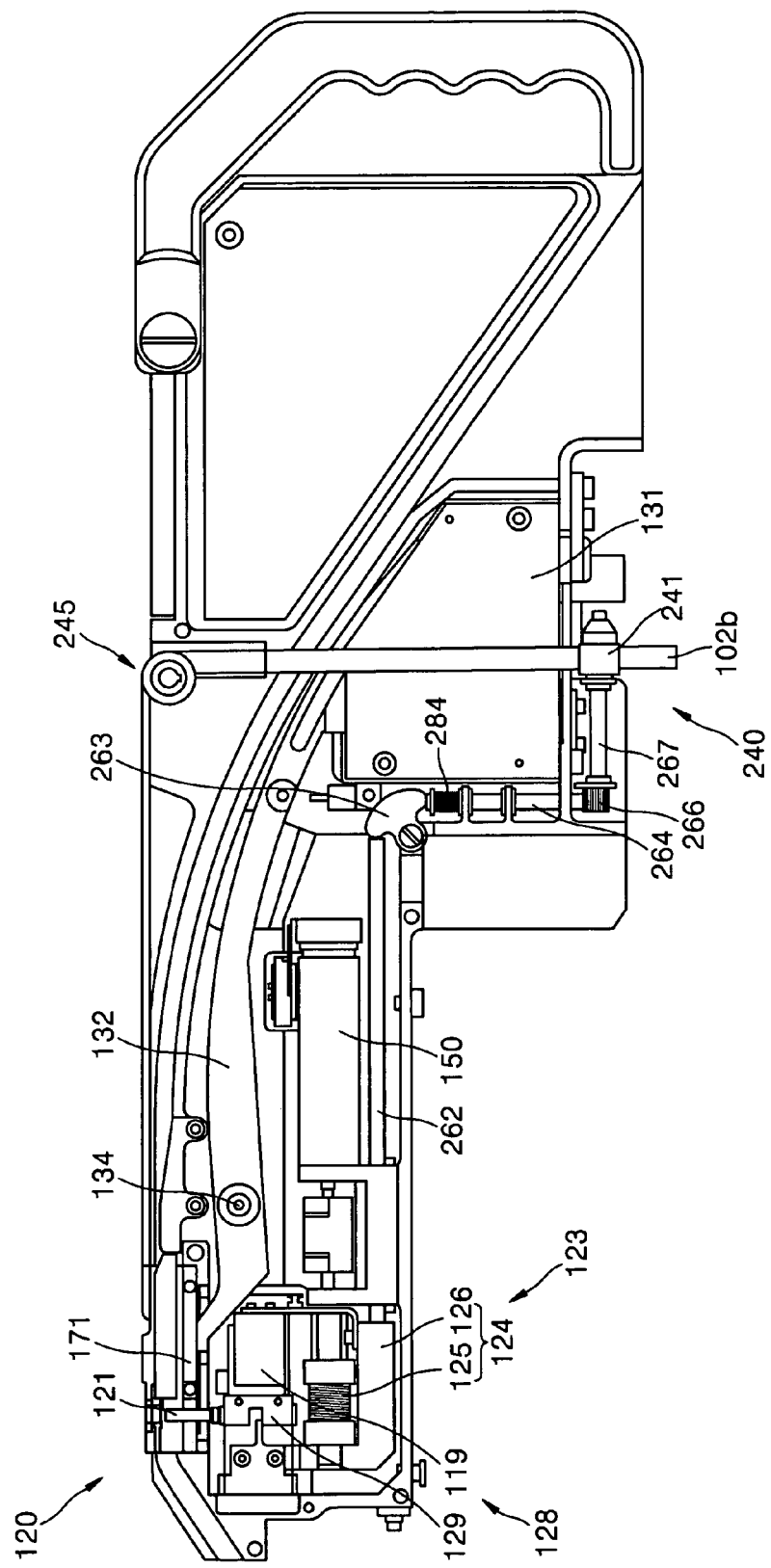
FIG. 9 is a perspective view of a tape feeder for a component mounter according to a second preferred embodiment of the present invention.
Figure 10:
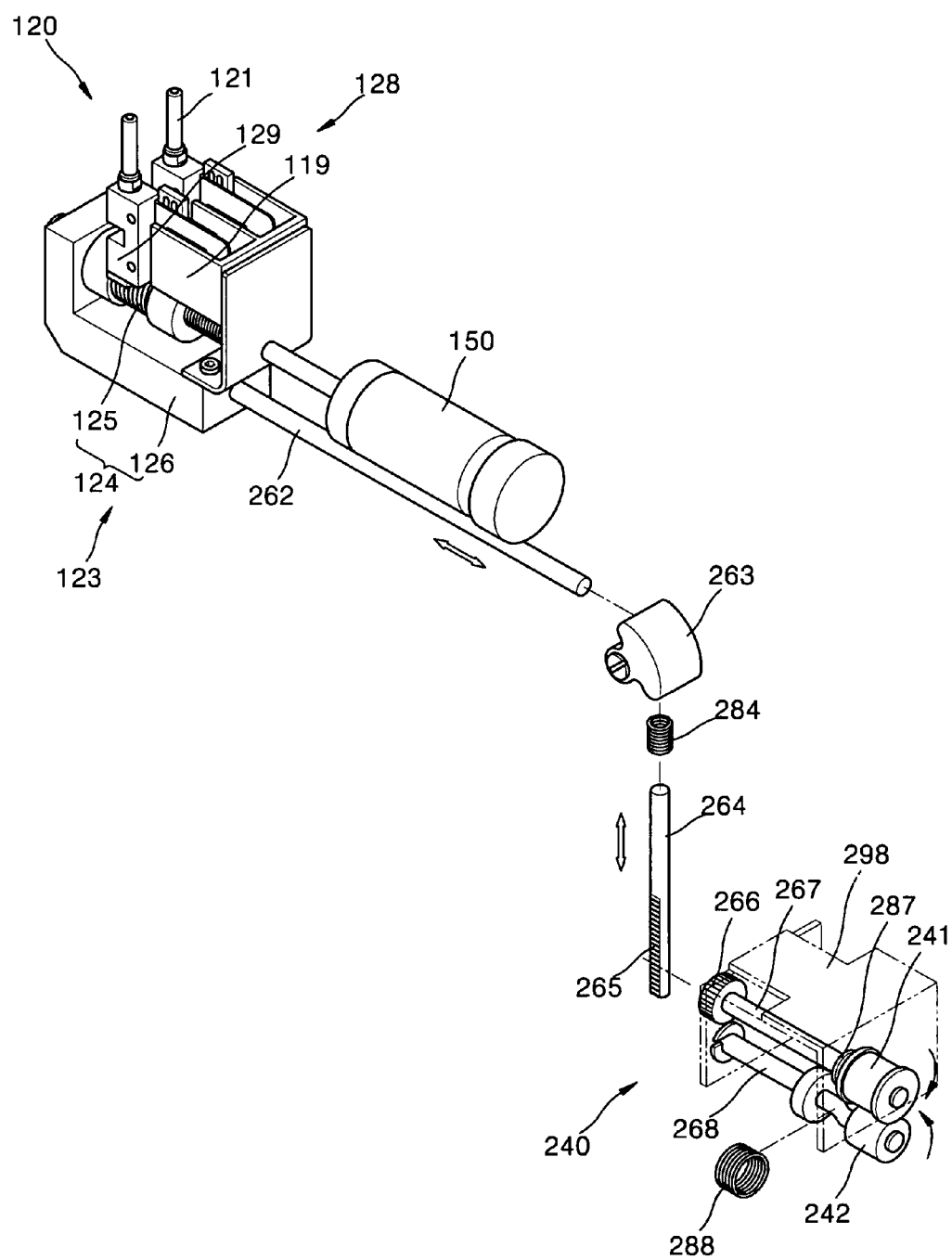
FIG. 10 is an exploded perspective view of a top cover discharging unit of the tape feeder of FIG. 9.

On the other hand, FIGS. 9 and 10 are respectively a sectional view of a tape feeder 200 for a component mounter according to a second preferred embodiment of the present invention and an exploded perspective view of a top cover discharging unit 240 of the tape feeder 200. Referring to FIGS. 9 and 10, the tape feeder 200 includes a frame 111, an index pin 121, which is disposed at one side of the frame 111, a pin moving unit 120, which includes a pin horizontally moving member 123 and a pin vertically moving member 128, and a top cover discharging unit 240, which is driven by the pin moving unit 120.

Here, the index pin 121 and the pin moving unit 120 of the second preferred embodiment are identical in structure and operation to the index pin 121 and the pin moving unit 120 of the first preferred embodiment, and accordingly, an explanation will now be given focusing on the top cover discharging unit 240.

The top cover discharging unit 240 is driven by the pin horizontally moving member 123, and includes a pair of discharge gears 241 and 242, which receive a top cover 102b of a tape 102 therebetween and discharge the top cover 102b when the index pin 121 moves forwardly.

To be more specific, the top cover discharging unit 240 includes the pair of discharge gears 241 and 242, a back and forth link 262, which is connected to the pin horizontally moving member 123 and moves backwardly and forwardly, a cam 263, which is connected to the other end of the back and forth link 262 and rotates vertically, a rack gear 265, which moves vertically according to the rotation of the cam 263, and a pinion 266, which meshes with the rack gear 265 and rotates when the rack gear 265 moves vertically.

The back and forth link 262 has one end connected to the pin horizontally moving member 123, such that the back and forth link 262 moves forwardly when the index pin 121 moves forwardly, and moves backwardly when the index pin 121 moves backwardly. The cam 263 connected to the other end of the back and forth link 262 rotates while the back and forth link 262 moves forwardly or backwardly. The back and forth link 262 and the cam 263 may be integrally formed with each other. In this case, the cam 263 is hinged and supported on the frame 111.

The pin horizontally moving member 123 includes a driving force transfer part 124, which is connected to the index pin 121 and moves horizontally the index pin 121, and a rotating motor 150, which drives the driving force transfer part 124. Here, it is preferable that the back and forth link 262 has the one end coupled to the driving force transfer part 124 of the pin horizontally moving unit 123 and can horizontally move. In this case, the driving force transfer unit 124 preferably includes a transfer bracket 126, which is horizontally moved with the index pin 121 by the rotating motor 150 and is connected to the one end of the back and forth link 262.

As the cam 263 rotates, the rack gear 265 meshing with the cam 263 moves. That is, it is preferable that a vertically moving shaft 264 has one end contacting the cam 263 and the other end on which the rack gear 265 is formed.

Hence, as the back and forth link 262 moves forwardly, the cam 263 rotates, accordingly, the vertically moving shaft 264 is lifted, and the rack gear 265 placed on the other end of the vertically moving shaft 264 is also lifted. In contrast, when the back and forth link 262 moves backwardly, the cam 263 reversely rotates, the vertically moving shaft 264 is lowered, and the rack gear 265 placed on the other end of the vertically moving shaft 264 is also lowered.

A first elastic spring 284 may be installed on the vertically moving shaft 264 to elastically bias the vertically moving shaft 264 toward the cam 263. The first elastic spring 284 provides an elastic force to the vertically moving shaft 264 so that the vertically moving shaft 264 can move vertically in a smooth manner.

The rack gear 265 is in contact with the pinion 266. A rotational direction of the pinion 266 is changed according to the rise and fall of the rack gear 265. The pinion 266 is connected to the main discharge gear 241.

The main discharge gear 241 rotates only when the pinion 266 rotates in one direction. To this end, the pinion 266 and the main discharge gear 241 are connected to each other by a main discharge shaft 267, and the main discharge shaft 267 and the main discharge gear 241 are connected by a one-direction bearing 287, such that the main discharge gear 241 can rotate only in one direction.

However, a one-direction clutch may be installed on the main discharge gear 241 such that when the pinion 266 rotates in one direction, the one-direction clutch does not operate and the main discharge gear 241 rotates, and when the pinion 266 rotates in the other direction, the one-direction clutch operates and prevents the main discharge gear 241 from rotating.

It is preferable that when the top cover 102b is under tension, it is discharged. This is because the top cover 102b and the tape 102 can be separated due to the tension. Accordingly, the idle discharge gear 242 is preferably provided such that the idle discharge gear 242 meshes with the main discharge gear 241 and rotates according to the rotation of the main discharge gear 241. Since the idle discharge gear 242 rotates in an opposite direction to a direction in which the main discharge gear 241 rotates, the top cover 102b can be discharged under the tension. Since the idle discharge gear 242 does not rotate when the main discharge gear 241 does not rotate, the top cover 102b is not discharged.

In this case, a portion where the main discharge gear 241 and the idle discharge gear 242 contact should be substantially parallel to the frame 111. The top cover discharging unit 240 may further include a discharge bracket 298, which is coupled to the frame 111 and supports the main discharge shaft 267, and the idle discharge gear 242 is supported by an idle discharge shaft 268 fixed to the discharge bracket 298.

Further, it is preferable that a second elastic spring 288 is installed on the idle discharge shaft 268 to elastically bias the idle discharge gear 242 toward the main discharge gear 241. This is because the second elastic spring 288 can restore a coupling force between the main discharge gear 241 and the idle discharge gear 242, which are worn due to repeated use.

That is, the second elastic spring 288 elastically supports the idle discharge gear 242 connected to the idle shaft toward the main discharge gear 241, so that the main discharge gear 241 and the idle discharge gear 242 can sufficiently mesh with each other without abrasion.

Here, the second elastic spring 288 is not large, different from a second discharge lever spring 67a provided in the conventional tape feeder 10.

The operation of the top cover discharging unit 240 constructed as above will now be explained in connection with the movement of the index pin 121. The index pin 121 and the back and forth link 262 are coupled to the driving force transfer part 124. Accordingly, when the index pin 121 is inserted into the tape hole 102c and moves forwardly, the back and forth link 262 moves forwardly, the cam 263 disposed on the other end of the back and forth link 262 rotates backwardly, and both the vertically moving shaft 264 contacting the cam 263 and the rack gear 265 formed on the other end of the vertically moving shaft 264 are lifted.

Consequently, the pinion 266 meshing with the rack gear 265 rotates in one direction, the main discharge gear 241 connected to the pinion 266 rotates in one direction, and the main discharge gear 241 meshes with the idle discharge gear 242 to outwardly discharge the top cover 102b.

In contrast, when the index pin 121 is separated from the tape hole 102c and backwardly moves, the back and forth link 262 also moves backwardly, the cam 263 disposed on the other end of the back and forth link 262 rotates forwardly, the rack gear 265 connected to the cam 263 is lowered, and the pinion 266 meshing with the rack gear 265 rotates in the other direction. In this case, the main discharge gear 241 does not rotate in the other direction due to the one-direction bearing 287, and the idle discharge gear 242 meshing with the main discharge gear 241 does not rotate as well, thereby preventing the top cover 102b from being inwardly transferred.

Figure 11:
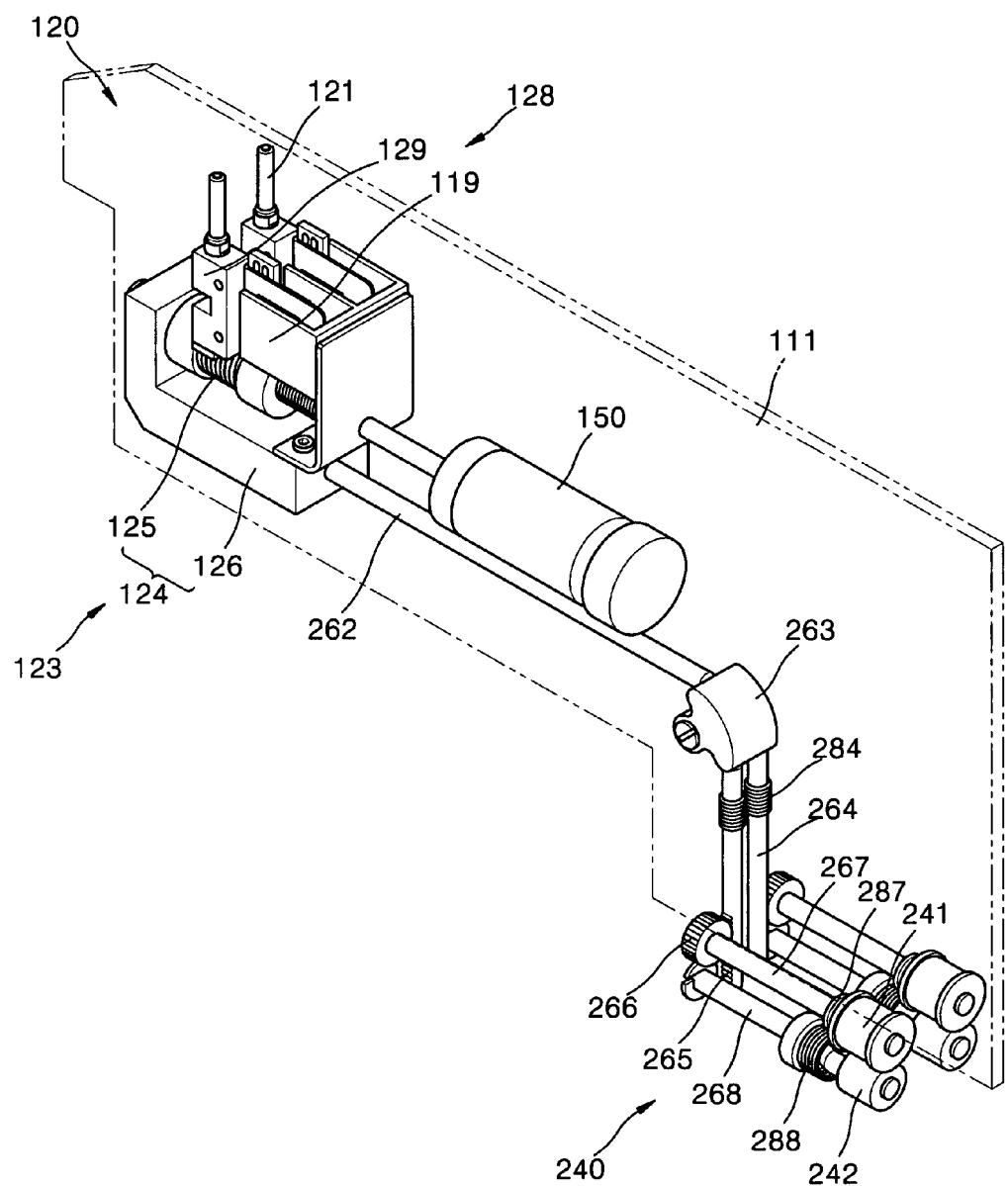
FIG. 11 is an exploded perspective view of two top cover discharging units of the tape feeder of FIG. 9.

Here, as shown in FIG. 11, a plurality of index pins 121 may be formed to transfer a plurality of strips of tape 102. In this case, all the index pins 121 are connected to one pin horizontally moving member 123, and the one pin horizontally moving member 123 is connected to one back and forth link 262 and one cam 263 formed on the other end of the back and forth link 262.

The cam 263 is connected to a plurality of vertically moving shafts 264. A plurality of rack gears 266 are formed corresponding to the plurality of vertically moving shafts 264. A plurality of pinions 267 are disposed corresponding to the plurality of rack gears 266, and a plurality of pairs of discharge gears 241 and 242 are disposed corresponding to the plurality of rack gears 266. Hence, a plurality of top covers 102b can be discharged.

Meanwhile, as shown in FIG. 9, a top surface 102b' of the top cover 102b, which is detached from the tape 102 and transferred in an opposite direction to a direction in which the tape 102 is transferred, has an inclination perpendicular to the frame 111. Accordingly, it is necessary to change an angle at which the top cover 102b is transferred so that the top surface 102b' of the top cover 102b can be parallel to the frame 111.

Figure 12:
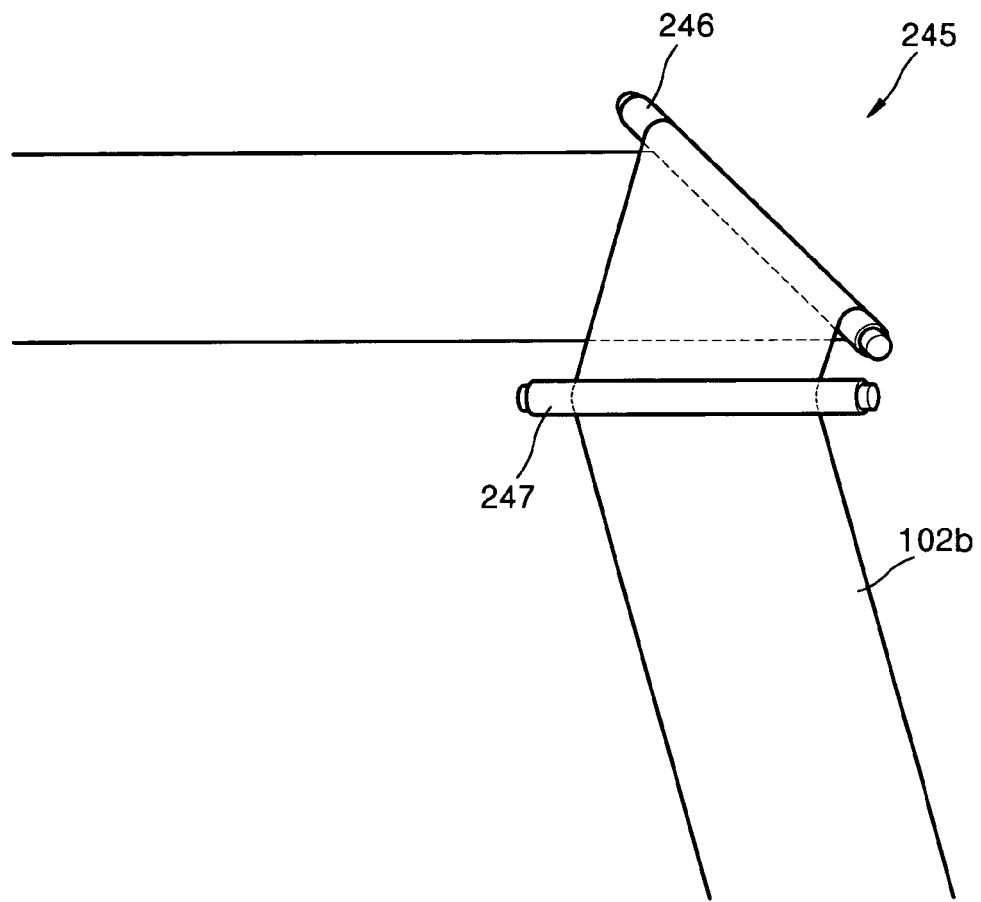
FIG. 12 is a perspective view of a top cover transfer angle changing system of the tape feeder of FIG. 9.
Figure 13:
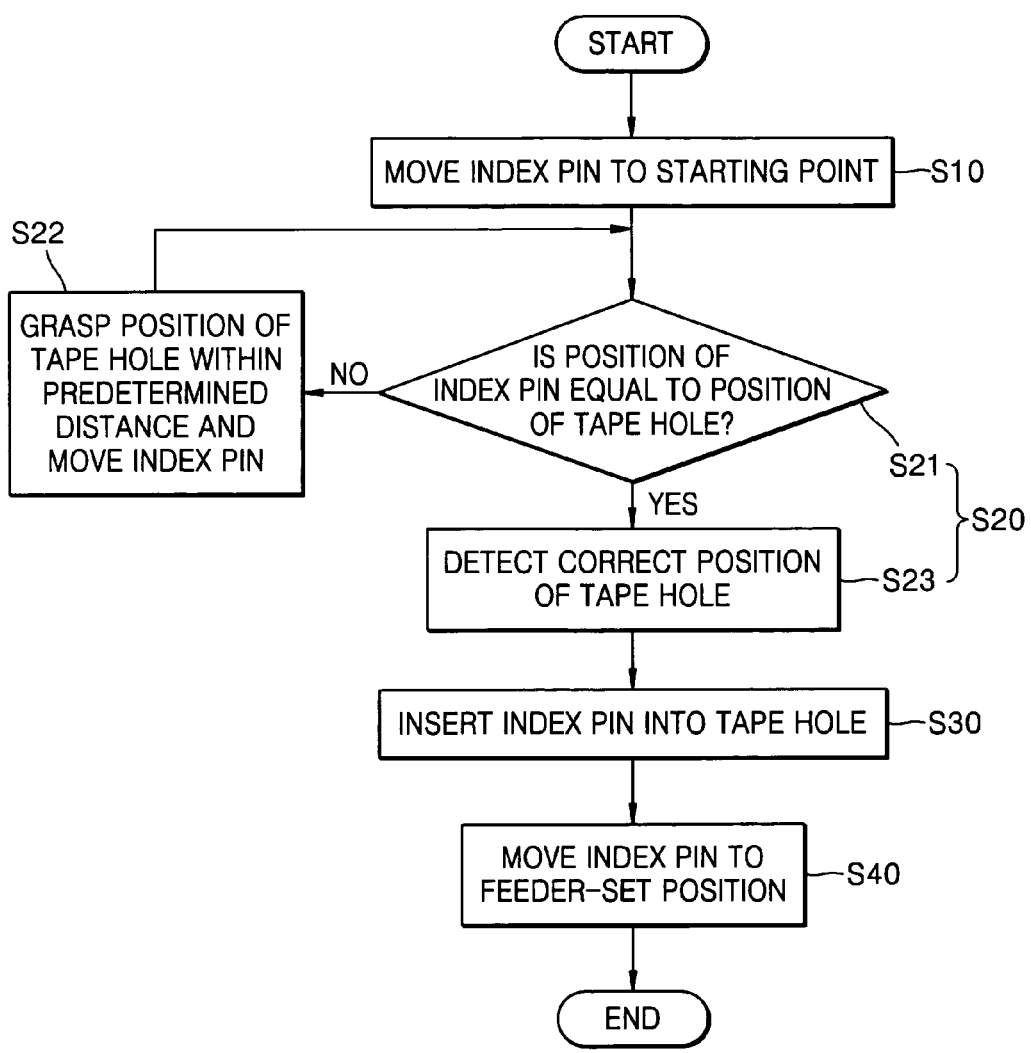
FIG. 13 is a flow chart of a method of automatically setting a tape initial position by the tape feeder for the component mounter according to the preferred embodiment of the present invention.
Figure 14A:
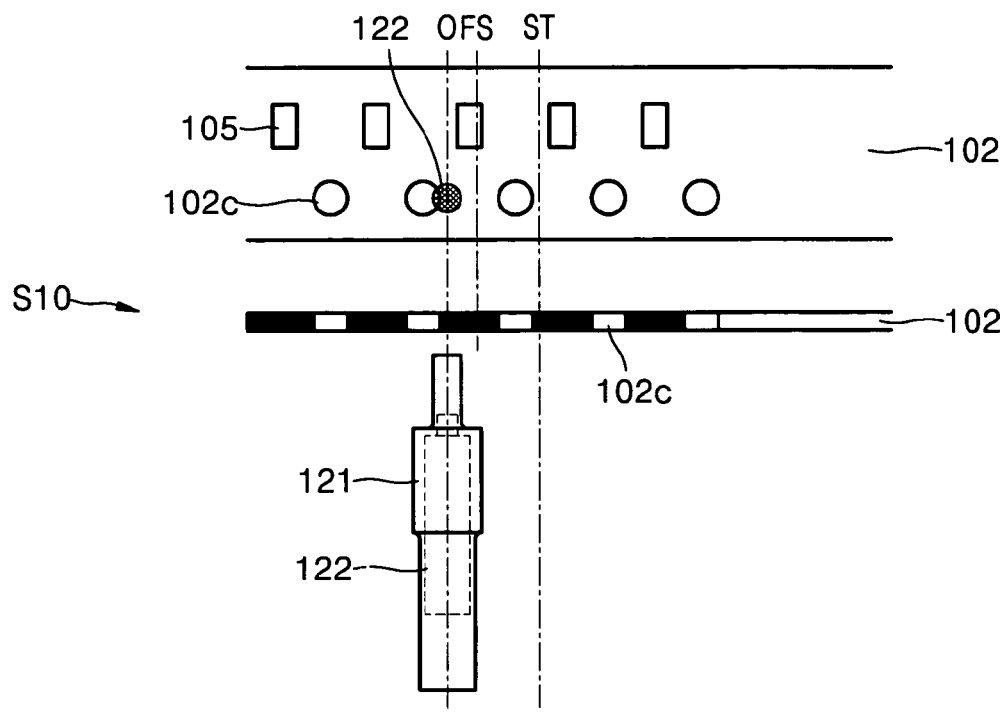
FIGS. 14A through 14E are sectional views for explaining respective operations of automatically setting the tape initial position by the tape feeder for the component mounter in the method of FIG. 13.
Figure 14B:
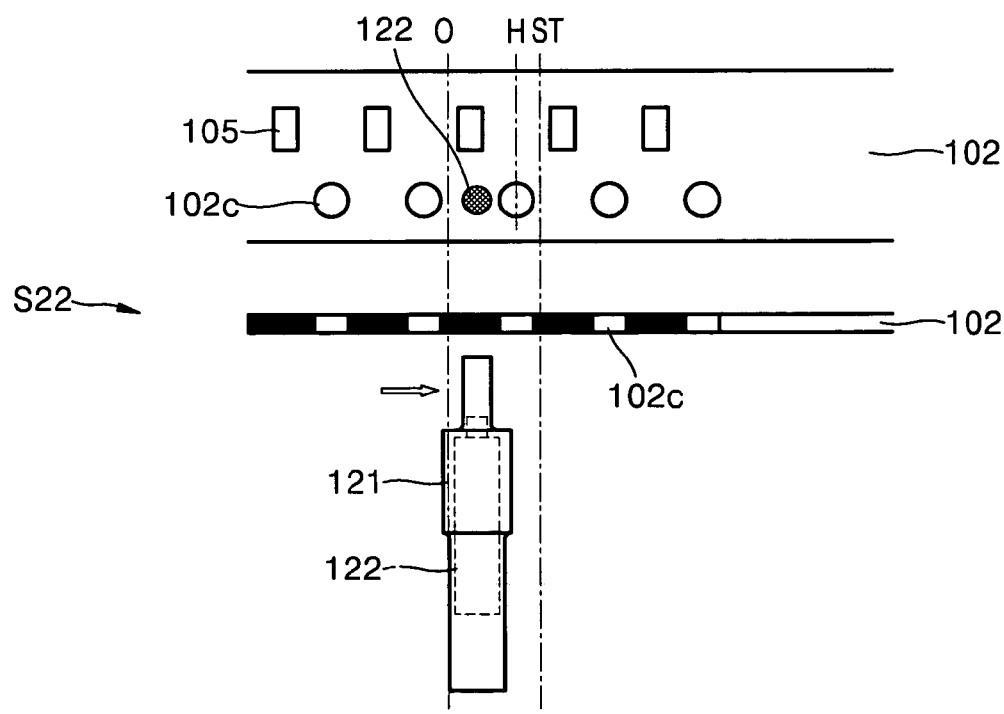
Figure 14C:
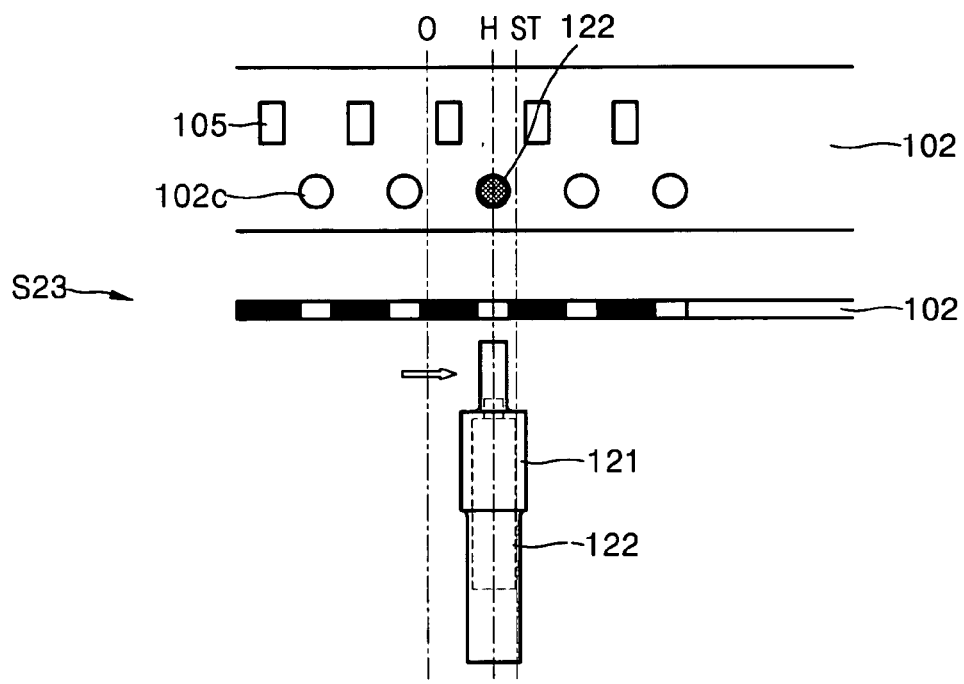
Figure 14D:
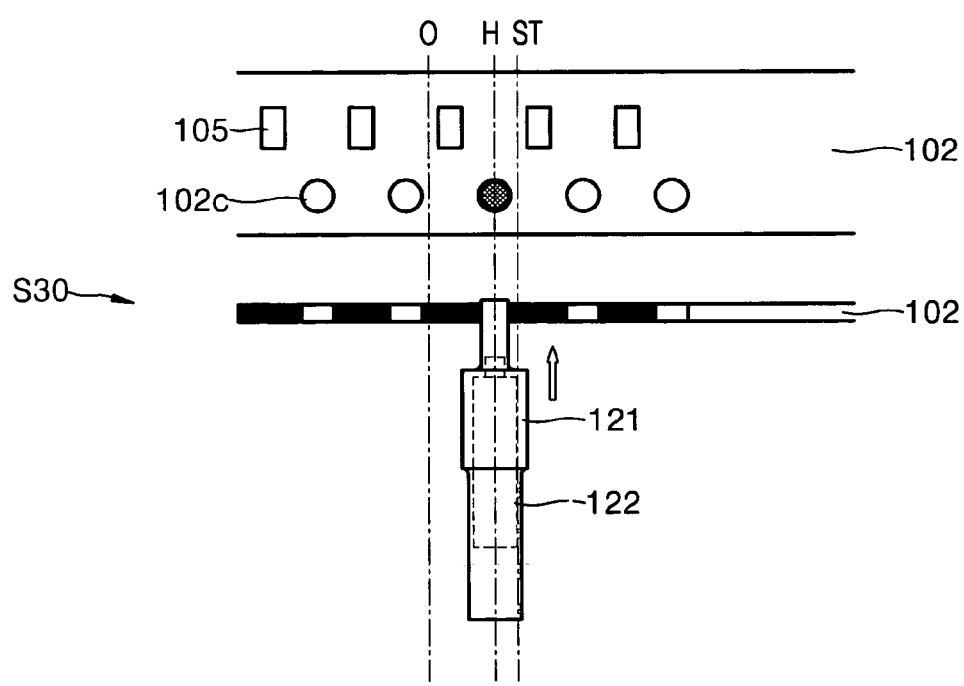
Figure 14E:
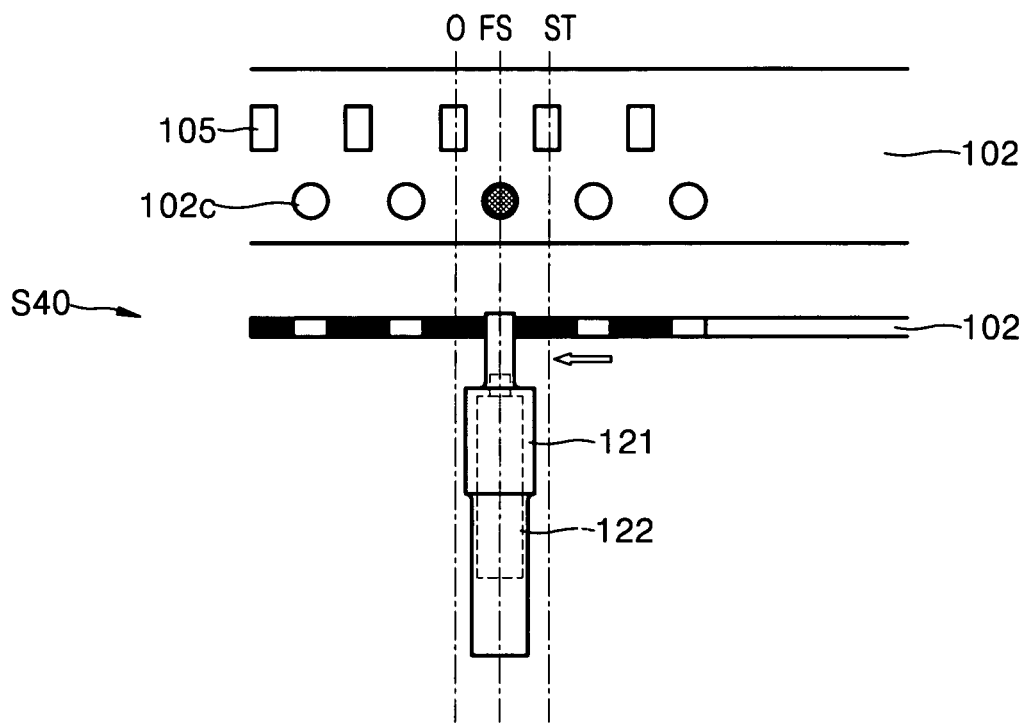

Therefore, as shown in FIGS. 9 and 12, it is preferable that a top cover transfer angle changing system 245 is further provided to change an angle at which the top cover 102b is transferred so that the top surface 102b' of the top cover 102b, which is detached from the tape 102 and is moved in the opposite direction to the tape transfer direction can be inserted between the pair of discharge gears 241 and 242.

The top cover transfer angle changing system 245 includes a first transfer angle changing rod 246 and a second transfer angle changing rod 247. The first transfer angle changing rod 246 changes the angle of the transferred top cover 102b so that the top surface 102b' of the top cover 102b, which is moved in the opposite direction to the tape transfer direction, can have a predetermined inclination with respect to the frame 111. The second transfer angle changing rod 247 changes the angle of the transferred top cover 102b once again so that the top surface 102b' of the top cover 102b with the predetermined inclination with respect to the frame 111 can be parallel to the frame 111.

According to another aspect of the present invention, there is provided a method of automatically setting a tape initial position by means of the index pin 121 of the tape feeder 100 for the component mounter, through which the tape hole 102c can be exactly transferred to the FS position so that the components attached to the tape 102 can be picked up at correct positions.

That is, the present invention provides a method of automatically and correctly moving the tape hole 102c to the predetermined FS position by means of the index pin 121 when the tape 102 is first inserted into the tape guide 171.

As shown in FIGS. 13, and 14A through 14E, the method of automatically setting the tape initial position according to the present invention includes the operation S10 of moving the index pin 121 to a starting point, the operation S20 of matching the hole 102c, the operation S30 of inserting the index pin 121, and the operation S40 of transferring the point to the FS position.

In operation S10, when the tape 102 is first inserted into the tape guide 171, the index pin 121 is automatically moved to the predetermined starting point.

In operation S20, the position of the tape hole 102c within the predetermined distance ST is grasped, and the index pin 121 is moved to a correct position of the tape hole 102c.

In operation S30, the index pin 121 is inserted into the tape hole 102c.

In operation S40, the index pin 121 is moved to the predetermined FS position. Through the operations, the automatic setting of the tape initial position is completed.

In this case, since the sensor 122 is disposed inside the index pin 121, when the index pin 121 with the sensor 122 therein is backwardly and forwardly moved by the pin horizontally moving member 123, the correct position of the tape hole 102c can be grasped, the index pin 121 can be easily moved to the correct position of the tape hole 102c, and the index pin 121 can be inserted into the tape hole 102c at a correct position. The sensor 122 is preferably a fiber optic sensor.

The hole matching operation S20 includes operation S21 in which it is judged whether the position of the tape hole 102c is equal to the position of the index pin 121.

If the position of the tape hole 102c is judged to be equal to the position of the index pin 121, the process proceeds to operation S23 in which the correct position of the tape hole 102c 121 is stored.

However, if the position of the tape hole 102c is judged not to be equal to the position of the index pin 121, the process proceeds to operation S22 in which the position of the tape hole 102c within the predetermined distance ST is grasped and the index pin 121 is moved to the position of the tape hole 102c. Then, the process returns to operation S21 in which it is judged whether the position of the tape hole 102c is equal to the position of the index pin 121.

Figure 15A:
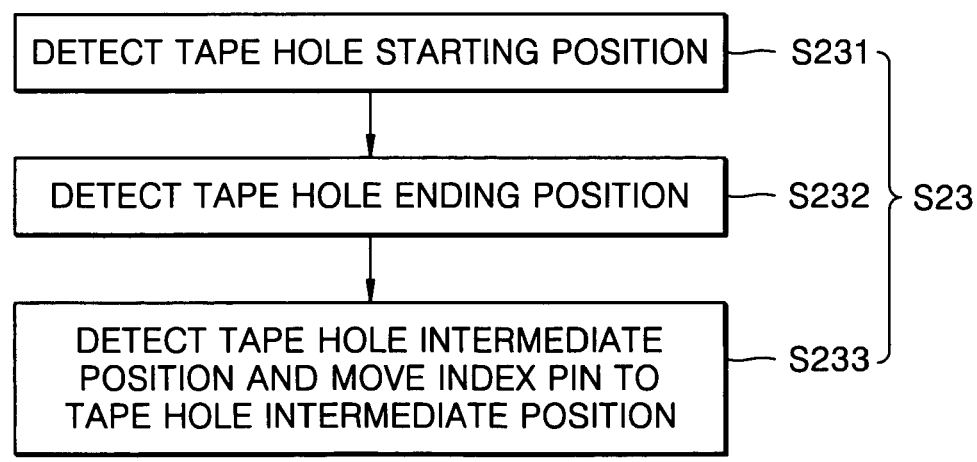
FIG. 15A is a flow chart illustrating an operation of storing a correct hole position among the operations of FIG. 14.
Figure 15B:
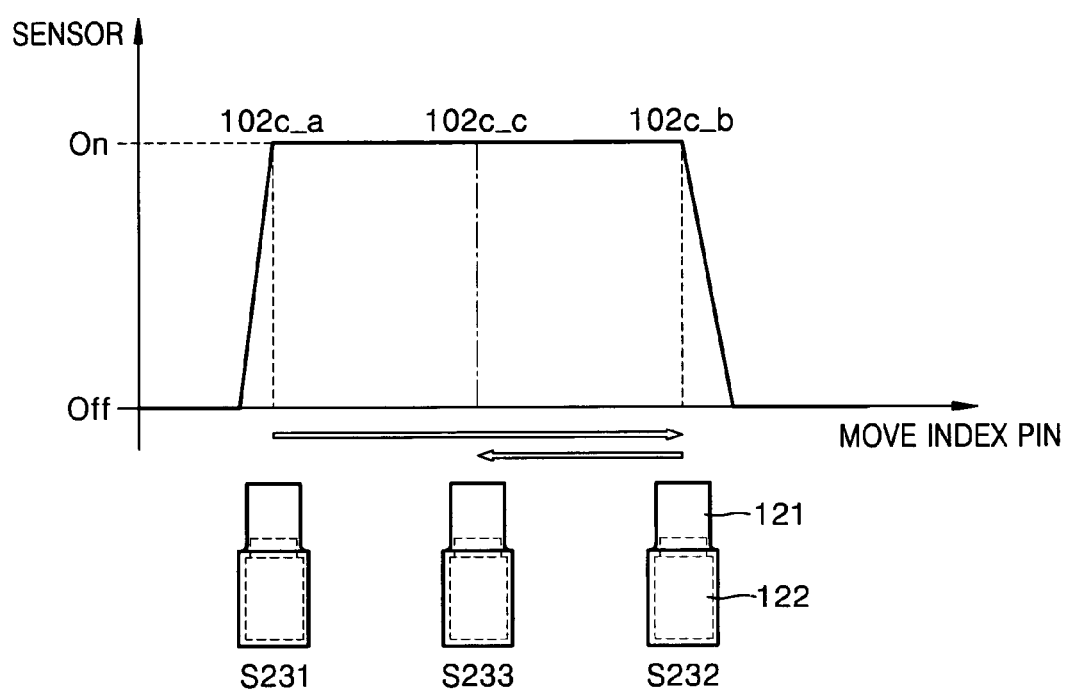
FIG. 15B is a graph illustrating the hole position storing operation in the flow chart of FIG. 15A.

In the meantime, as shown in FIGS. 15A and 15B, the index pin correct position storing operation S23 includes operation S231 in which the index pin 121 is moved from the predetermined starting point 0 to a tape hole starting position 102c_a within the predetermined distance ST and the tape hole starting position 102c_a is detected, operation S232 in which the index pin 121 is moved to a tape hole ending position 102c_b and the tape hole ending position 102c_b is detected, and operation S233 in which the index pin 121 is moved to a tape hole intermediate position 102c_c between the tape hole starting position 102c_a and the tape hole ending position 102c_b, and the correct position of the index pin 121 is stored. That is, while the index pin 121 is moved from the starting point 0 by the predetermined distance ST, the sensor 122 inside the index pin 121 detects the tape hole starting position 102c_a, the tape hole ending position 102c_b, and the tape hole intermediate position 102c_c.

In this case, when the index pin 121 is inserted into the tape hole 102b to move the tape 102 to the FS position, the tape fixing unit 130 (see FIG. 7) does not contact the tape 102 so as for the tape 102 to be smoothly transferred.

Meantime, when the index pin 121 is not inserted into the tape hole 102b, the tape fixing unit 130 contacts the tape 102 to prevent the tape 102 from shaking.

As described above, the present invention has the following effects.

First, since the index pin is used instead of a sprocket to transfer the tape, stable transfer can be achieved even though the tape hole is small.

Second, since one small pin horizontally moving member can transfer a plurality of index pins, one tape feeder having a small thickness can feed a plurality of strips of tape.

Third, since the index pin is linearly moved using the rotating motor and the driving force transfer part, and thus, the tape can linearly move within the predetermined distance, high precision can be ensured in picking up the components.

Fourth, since the sensor is mounted inside the index pin, the index pin can be moved to the correct position of the tape hole and then inserted into the tape hole.

Fifth, the top cover discharging unit is small and simple in structure, and particularly, in case of a large tape feeder, the top cover can be easily discharged in the direction orthogonal to the tape transfer direction.

Sixth, since the separating blade is provided behind the index pin, and accordingly, the top cover is easily detached from the tape, the top cover discharging unit does not need excessive tension to separate the top cover from the tape.

Seventh, since the index pin is automatically inserted into the tape hole and moved to the set position, differently from the conventional art in which the sprocket is manually inserted into the tape hole of the tape, precision in the tape transfer is improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A tape feeder for a component mounter, the tape feeder comprising:
   a frame;
   at least one index pin, which transfers a tape via insertion into a tape hole and forward movement;
   an optical sensor in the at least one index pin for detecting a position of the at least one index pin relative to the tape hole; and
   a pin moving unit, which includes a pin longitudinally moving member for moving the index pin and the optical sensor in a direction of tape transfer, and a pin orthogonally moving member for moving the index pin and the optical sensor in a direction generally orthogonal to the longitudinal movement, so that the index pin can be inserted into or removed from the tape hole.

2. The tape feeder of claim 1, wherein the pin longitudinally moving member comprises:
   a driving force transfer part, which is connected to the index pin and moves backwardly and forwardly; and
   a rotating motor, which drives the driving force transfer part.

3. The tape feeder of claim 1, wherein the pin orthogonally moving member comprises a voice coil motor, which is connected to a lower portion of the index pin and moves the index pin.

4. The tape feeder of claim 3, wherein at least two index pins are formed in parallel, voice coil motors are placed corresponding to the index pins, and all the index pins are connected to the pin longitudinally moving member.

5. The tape feeder of claim 1, further comprising a tape fixing unit, wherein the tape fixing unit comprises:
   a clamp driving motor;
   a clamp arm, which is connected to the clamp driving motor, which has one end on which a movable motor connecting part is formed and the other end on which a projecting tape fixing part is formed, and which is disposed along a tape transfer path adjacent the tape; and
   a clamp arm hinge axis part, which is installed on a central portion of the clamp arm and fixes the tape by lifting the tape fixing part formed on the other end of the clamp arm when the motor connecting part formed on the one end of the clamp arm is lowered.

6. The tape feeder of claim 5, wherein the tape fixing unit comprises a clamp arm spring, which is connected between the clamp arm and the frame and elastically supports the clamp arm.

7. The tape feeder of claim 1, further comprising:
   a separating blade, which is installed behind the index pin in a tape transfer direction and is moved between the tape and the top cover to separate the top cover from the tape.

8. The tape feeder of claim 1, further comprising:
   a top cover discharging unit, which discharges a top cover detached from the tape.

9. The tape feeder of claim 1 wherein the optical sensor is coaxial with a central axis through the at least one index pin.

10. The tape feeder of claim 1, further comprising:
a top cover discharging unit, which is driven by the pin longitudinally moving member, and which includes a pair of discharge gears that receive a top cover of the tape therebetween and that discharge the top cover when the index pin moves forwardly.

11. The tape feeder of claim 10, wherein the top cover discharging unit comprises:
a back and forth link, which has one end connected to the pin longitudinally moving member and moves backwardly and forwardly;
a cam, which is connected to another end of the back and forth link and rotates when the back and forth link moves backwardly and forwardly;
a rack gear, which meshes with the cam and moves when the cam rotates;
a pinion, which meshes with the rack gear and rotates when the rack gear moves; and
the pair of discharge gears, wherein the pair of discharge gears includes a main discharge gear, which rotates only when the pinion rotates in one direction, and an idle discharge gear, such that the main discharge gear and the idle discharge gear receive the top cover therebetween and discharge the top cover.

12. The tape feeder of claim 11, wherein the rack gear is disposed on an end of an orthogonally moving shaft and the other end of the orthogonally moving shaft contacts the cam such that the orthogonally moving shaft moves according to a rotational direction of the cam, and a first elastic spring elastically biases the orthogonally moving shaft toward the cam so that the orthogonally moving shaft contacts the cam.

13. The tape feeder of claim 11, wherein the pinion and the main discharge gear are connected by a main discharge shaft, and the main discharge shaft and the main discharge gear are connected by a one-direction bearing.

14. The tape feeder of claim 11, wherein the top cover discharging unit further comprises a discharge bracket, which is coupled to the frame and supports the main discharge shaft; wherein the idle discharge gear is supported by an idle discharge shaft fixed to the discharge bracket; and wherein a second elastic spring is installed on the idle discharge shaft to elastically bias the idle discharge gear toward the main discharge gear.

15. The tape feeder of claim 11, wherein the pin horizontally moving member comprises a driving force transfer part, which is connected to the index pin and moves backwardly and forwardly the index pin, and a rotating motor, which drives the driving force transfer part, and wherein the back and forth link is connected to the driving force transfer part and moves backwardly and forwardly.

16. The tape feeder of claim 11, wherein a plurality of index pins are formed to transfer a plurality of strips of tape, wherein all the index pins are connected to one pin longitudinally moving member, one back and forth link, and one cam, and wherein a plurality of orthogonally moving shafts are formed corresponding to the index pins and coupled to the cam.

17. A tape feeder for a component mounter, the tape feeder comprising:
a generally planar frame defining a first axis and a second axis generally perpendicular to the first axis;
a first actuator configured parallel to one of the first axis and the second axis, the first actuator including a first movable member that reciprocates along said one of the first axis and the second axis;
a bracket connected to the first movable member for movement along said one of the first axis and the second axis;
a second actuator connected to the bracket and configured parallel to the other one of the first axis and the second axis, the second actuator including a second movable member that reciprocates along said other one of the first axis and the second axis;
an index pin connected to the second movable member for engaging a plurality of tape holes in a tape and incrementally advancing the tape; and
an optical sensor that is disposed in the index pin and coaxial with a central axis through the index pin.

18. The tape feeder of claim 17 further comprising a tape fixing unit that prevents movement of the tape when the index pin is disengaged from a tape hole of the plurality.

19. The tape feeder of claim 17 further comprising a top cover discharging unit that discharges a top cover detached from the tape.

* * * * *